(12) United States Patent
Hayashi et al.

(10) Patent No.: US 9,209,323 B2
(45) Date of Patent: Dec. 8, 2015

(54) CONDUCTIVE PASTE USED FOR SOLAR CELL ELECTRODES AND METHOD OF MANUFACTURING THE SOLAR CELL ELECTRODES

(71) Applicant: E I DU PONT DE NEMOURS AND COMPANY, Wilmington, DE (US)

(72) Inventors: Isao Hayashi, Kanagawa (JP); Yumi Matsuura, Kanagawa (JP)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 73 days.

(21) Appl. No.: 14/269,313

(22) Filed: May 5, 2014

(65) Prior Publication Data

US 2015/0318419 A1  Nov. 5, 2015

(51) Int. Cl.
*H01L 21/00* (2006.01)
*H01L 31/0224* (2006.01)
*H01L 31/18* (2006.01)

(52) U.S. Cl.
CPC ........ *H01L 31/022425* (2013.01); *H01L 31/18* (2013.01)

(58) Field of Classification Search
CPC .................. H01L 31/022425; H01L 31/18
See application file for complete search history.

(56) References Cited

U.S. PATENT DOCUMENTS

| | | |
|---|---|---|
| 2010/0258165 A1 | 10/2010 | Carroll et al. |
| 2010/0258166 A1 | 10/2010 | Laughlin et al. |
| 2010/0258184 A1 | 10/2010 | Laughlin et al. |
| 2010/0308462 A1 | 12/2010 | Konno et al. |
| 2011/0048527 A1 | 3/2011 | Irizarry et al. |
| 2011/0147677 A1 | 6/2011 | Carroll et al. |
| 2011/0308597 A1 | 12/2011 | Carroll et al. |
| 2013/0043440 A1 | 2/2013 | Vernooy et al. |

FOREIGN PATENT DOCUMENTS

| | | |
|---|---|---|
| JP | 2011/233548 | 11/2011 |
| WO | 2009/146398 A1 | 12/2009 |

*Primary Examiner* — Richard Booth

(57) ABSTRACT

A conductive paste used for a solar cell electrode comprising, (i) 60 wt % to 95 wt % of a conductive powder; (ii) 0.1 wt % to 5.0 wt % of a lead-tellurium-oxide powder, comprising 20 wt % to 60 wt % of PbO and 20 wt % to 60 wt % of $TeO_2$ based on the total weight of the lead-tellurium-oxide powder; (iii) 3 wt % to 38 wt % of an organic medium; and (iv) 0.1 wt % to 1.5 wt % of an inorganic oxide powder selected from the group consisting of $Ho_2O_3$, $La_2O_3$, $Sm_2O_3$, $Y_2O_3$, $Yb_2O_3$, $Gd_2O_3$ and a mixture thereof, based on the total weight of the conductive paste.

6 Claims, 1 Drawing Sheet

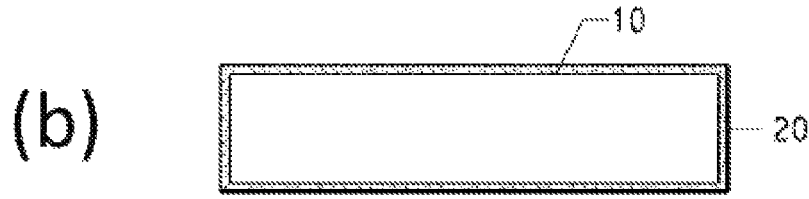
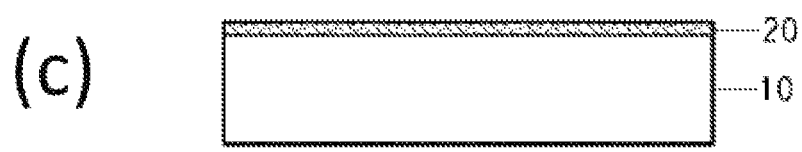
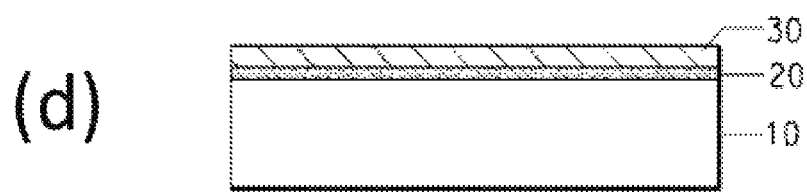
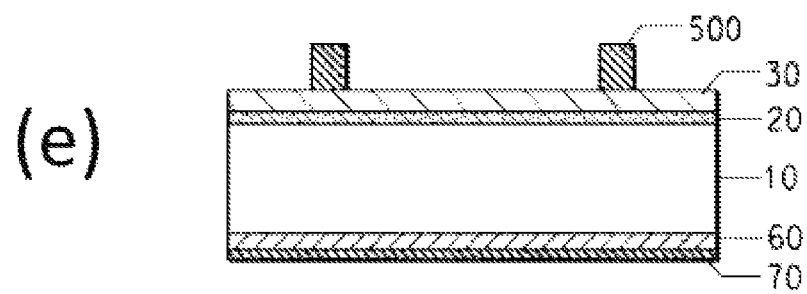
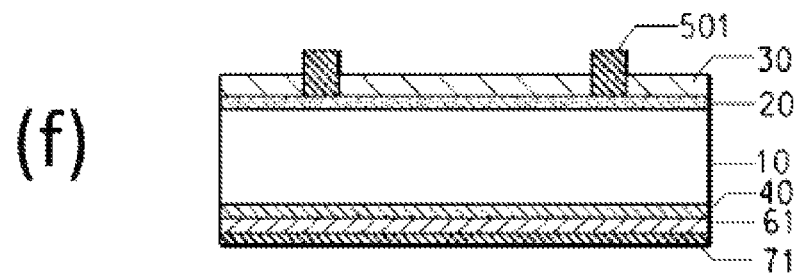

CONDUCTIVE PASTE USED FOR SOLAR CELL ELECTRODES AND METHOD OF MANUFACTURING THE SOLAR CELL ELECTRODES

FIELD OF THE INVENTION

The invention relates to a conductive paste to form solar cell electrodes and method of manufacturing the solar cell electrodes.

TECHNICAL BACKGROUND OF THE INVENTION

Electrodes of silicon solar cells are typically formed by printing a paste onto a silicon substrate. US-2011-0308597 discloses a thick-film paste comprising an electrically conductive metal, and a lead-tellurium-lithium-oxide dispersed in an organic medium. Following the printing step, the substrate and the paste are fired to form a dense solid of electrically conductive traces.

SUMMARY OF THE INVENTION

In one aspect, the present invention relates to a conductive paste used for a solar cell electrode comprising (i) 60 wt % to 95 wt % of a conductive powder, based on the total weight of the conductive paste; (ii) 0.1 wt % to 5.0 wt % of a lead-tellurium-oxide powder, based on the total weight of the conductive paste, comprising 20 wt % to 60 wt % of PbO and 20 wt % to 60 wt % of $TeO_2$, based on the total weight of the lead-tellurium-oxide powder; (iii) 3 wt % to 38 wt % of an organic medium, based on the total weight of the conductive paste; and (iv) 0.1 wt % to 1.5 wt % of an inorganic oxide powder selected from the group consisting of $Ho_2O_3$, $La_2O_3$, $Sm_2O_3$, $Y_2O_3$, $Yb_2O_3$, $Gd_2O_3$ and a mixture thereof, based on the total weight of the conductive paste.

In another aspect, the present invention relates to a method of manufacturing a solar cell electrode comprising steps of: preparing a semiconductor substrate comprising a front side and a back side; applying onto the front side of the semiconductor substrate a conductive paste comprising, (i) 60 wt % to 95 wt % of a conductive powder, based on the total weight of the conductive paste, (ii) 0.1 wt % to 5.0 wt % of a lead-tellurium-oxide powder, based on the total weight of the conductive paste, comprising 20 wt % to 60 wt % of PbO and 20 wt % to 60 wt % of $TeO_2$, based on the total weight of the lead-tellurium-oxide powder, (iii) 3 wt % to 38 wt % of an organic medium, based on the total weight of the conductive paste, and (iv) 0.1 wt % to 1.5 wt % of an inorganic oxide powder selected from the group consisting of $Ho_2O_3$, $La_2O_3$, $Sm_2O_3$, $Y_2O_3$, $Yb_2O_3$, $Gd_2O_3$ and a mixture thereof, based on the total weight of the conductive paste; and firing the applied conductive paste to form an electrode.

BRIEF DESCRIPTION OF THE DRAWINGS

FIG. 1 shows a process flow diagram illustrating the fabrication of a solar cell.

DETAILED DESCRIPTION OF THE INVENTION

Conductive Paste:

In an embodiment, the conductive paste used for solar cell electrodes comprises a conductive powder, a lead-tellurium-oxide powder, an organic medium and a specific inorganic oxide powder.

(i) Conductive Powder

The conductive powder is a metal powder having an electrical conductivity. The electrical conductivity of the conductive powder is $1.00 \times 10^7$ Siemens (S)/m or higher at 293 Kelvin in an embodiment.

The conductive powder can comprise a metal selected from the group consisting of iron (Fe; $1.00 \times 10^7$ S/m), aluminum (Al, $3.64 \times 10^7$ S/m), nickel (Ni; $1.45 \times 10^7$ S/m), copper (Cu; $5.81 \times 10^7$ S/m), silver (Ag; $6.17 \times 10^7$ S/m), gold (Au; $4.17 \times 10^7$ S/m), molybdenum (Mo; $2.10 \times 10^7$ S/m), tungsten ON; $1.82 \times 10^7$ S/m), cobalt (Co; $1.46 \times 10^7$ S/m), zinc (Zn; $1.64 \times 10^7$ S/m), an alloy thereof and a mixture thereof in an embodiment.

The conductive powder can comprise a metal selected from the group consisting of Al, Cu, Ag, Zn, an alloy thereof and a mixture thereof in another embodiment. The conductive powder can comprise Cu, Ag, Au, or an alloy thereof in another embodiment. In still another embodiment, the conductive powder can be Al element powder, Cu element powder, Ag element powder, or a mixture thereof. The conductive powder comprises Ag element powder, Al element powder, or a mixture thereof in another embodiment.

The conductive powder can be an alloy powder comprises Ag, Al or both of Ag and Al, for example an alloy of Ag—Al, Ag—Cu, Ag—Ni, and Ag—Cu—Ni.

Using such conductive powder with high electrical conductivity, electrical property of the electrode can be improved. The conductive power to form the front-side electrode comprises at least silver powder, in an embodiment.

Purity of the conductive powder can be 90 weight percent (wt %) in an embodiment, 98 wt % in another embodiment based on the weight of the conductive powder.

In an embodiment, the silver powder is in a flake form, a spherical form, a granular form, a crystalline form, other irregular form or mixtures thereof.

The mean particle size (D50) of the conductive powder can be 0.1 µm to 10 µm in an embodiment, 0.5 to 8 µm in another embodiment, and 1 µm to 5 µm in still further embodiment. The conductive powder with such particle diameter can be adequately dispersed in the organic binder and solvent, and smoothly applied by printing.

The amount of conductive powder in the conductive paste is 60 wt % to 95 wt % in an embodiment, 65 wt % to 92 wt % in another embodiment, 70 wt % to 90 wt % in further embodiment, based on the total weight of the conductive paste, in view of conductivity. The conductive paste containing the conductive powder within the above ranges can form, with satisfactory printability, an electrode pattern with a fine line width.

The conductive powder can be coated or not coated with organic materials such as surfactant and phosphorous-containing compounds. In an embodiment, the conductive powder can be coated with a surfactant, particularly when the conductive powder is too finely divided to disperse well in the organic medium. Suitable surfactants include polyethyleneoxide, polyethyleneglycol, benzotriazole, poly(ethyleneglycol) acetic acid, lauric acid, oleic acid, capric acid, myristic acid, linolic acid, stearic acid, palmitic acid, stearate salts, palmitate salts, and mixtures thereof.

(ii) Lead-Tellurium-Oxide Powder (Glass Frit)

The lead-tellurium-oxide powder comprises 20 wt % to 60 wt % of PbO in an embodiment, 25 wt % to 55 wt % of PbO in another embodiment, 30 wt % to 50 wt % of PbO in a further embodiment, based on the total weight of the lead-tellurium-oxide powder. The lead-tellurium-oxide powder comprises 20 wt % to 60 wt % of $TeO_2$ in an embodiment, 30 wt % to 60 wt % of $TeO_2$ in another embodiment, 35 wt % to 58 wt % of TeO$_2$ in still further embodiment, based on the total weight of the lead-tellurium-oxide powder.

The softening point of the lead-tellurium-oxide powder comprising the above component within the above ranges can be effectively kept low, resulting in a solar cell with high electrical characteristics.

In an embodiment, the lead-tellurium-oxide powder can comprise an eutectic phase. In another embodiment, the lead-tellurium-oxide powder can comprise an amorphous phase. In this disclosure, "eutectic" is to be a mixture of chemical compounds or elements that have a single chemical composition that solidifies at a lower temperature than any other composition made up of the same ingredients. In this disclosure, "amorphous" is to lack the long-range order characteristic of a crystal.

In an embodiment, the lead-tellurium-oxide powder may also contain additional components such as silicon, silver, tin, bismuth, aluminum, titanium, copper, lithium, cerium, zirconium, sodium, vanadium, zinc, fluorine, boron, magnesium, cobalt, ruthenium, nickel, cesium, manganese, potassium, tantalum, and niobium. In an embodiment, the lead-tellurium-oxide powder is a lead-tellurium-lithium-oxide powder.

In an embodiment, the lead-tellurium-oxide powder is prepared by mixing PbO, TeO$_2$ and other materials that decompose into the oxides when heated using techniques understood by one of ordinary skill in the art. Such preparation techniques may involve heating the mixture in air or an oxygen-containing atmosphere to form a melt, quenching the melt, and grinding, milling, and/or screening the quenched material to provide a powder with the desired particle size. Melting the mixture of lead, tellurium and other materials oxides is typically conducted at a peak temperature of 800 to 1200° C. The molten mixture can be quenched, for example, on a stainless steel platen or between counter-rotating stainless steel rollers to form a platelet. The resulting platelet can be milled to form a powder.

In an embodiment, the milled powder has a mean particle seize (D50) of 0.1 to 3.0 microns. One skilled in the art may employ alternative synthesis techniques such as but not limited to water quenching, sol-gel, spray pyrolysis, and so on.

In an embodiment, the lead-tellurium-oxide powder may be a homogenous powder. In a further embodiment, the lead-tellurium-oxide powder may be a combination of more than one powder.

The lead-tellurium-oxide powder is 0.1 wt % to 5.0 wt % in an embodiment, 0.3 wt % to 3.0 wt % in another embodiment, 1.0 wt % to 2.8 wt % in further embodiment, based on the total weight of the conductive paste, in view of obtaining an improved electrical performance.

One of ordinary skill in the art would recognize that the choice of raw materials could unintentionally include impurities that may be incorporated into the lead-tellurium-inorganic oxide powder during processing. For example, the impurities may be present in the range of hundreds to thousands ppm. The presence of the impurities would not alter the properties of the glass, the thick film composition, or the fired device. For example, a solar cell containing the thick-film composition may have the efficiency described herein, even if the thick-film composition includes impurities.

(iii) Organic Medium

The inorganic components of the conductive paste are mixed with an organic medium to form viscous thick film pastes or less viscous inks having suitable consistency and rheology for printing. A wide variety of inert viscous materials can be used as the organic medium. The organic medium can be one in which the inorganic components are dispersible with an adequate degree of stability during manufacturing, shipping and storage of the pastes or inks, as well as on the printing screen during a screen-printing process.

In an embodiment, the organic medium have rheological properties that provide stable dispersion of solids, appropriate viscosity and thixotropy for printing, appropriate wettability of the substrate and the paste solids, a good drying rate, and good firing properties.

In an embodiment, the organic medium can contain thickeners, stabilizers, surfactants, and/or other common additives. One such thixotropic thickener is Thixatrol® (Elementis plc, London, UK).

In an embodiment, the organic medium can be a solution of polymer(s) in organic solvent(s) as polymer binder. In an embodiment, the polymers include ethyl cellulose, ethylhydroxyethyl cellulose, wood rosin, mixtures of ethyl cellulose and phenolic resins, polymethacrylates of lower alcohols, and the monobutyl ether of ethylene glycol monoacetate. In an embodiment, the organic solvents include texanol, terpenes such as alpha- or beta-terpineol or mixtures thereof with other solvents such as kerosene, dibutylphthalate, butyl carbitol, butyl carbitol acetate, hexylene glycol and alcohols with boiling points above 150° C., and alcohol esters. Other suitable organic medium components include: bis(2-(2-butoxy-ethoxy)ethyl adipate, dibasic esters such as DBE, DBE-2, DBE-3, DBE-4, DBE-5, DBE-6, DBE-9, and DBE 1B, octyl epoxy tallate, isotetradecanol, and pentaerythritol ester of hydrogenated rosin.

In an embodiment, the organic medium comprises volatile liquids to promote rapid hardening after application of the paste composition on a substrate.

The optimal amount of organic medium in the conductive paste is dependent on the method of applying the composition and the specific organic medium used. The conductive paste contains 3 to 38 wt % of the organic medium in an embodiment, based on the total weight of the conductive paste.

In case the organic medium comprises a polymer binder, the organic medium comprises 5 to 75 wt % of the organic binder in an embodiment.

(iv) Inorganic Oxide Powder

In an embodiment, the conductive paste comprises an inorganic oxide powder selected from the group consisting of Ho$_2$O$_3$, La$_2$O$_3$, Sm$_2$O$_3$, Y$_2$O$_3$, Yb$_2$O$_3$, Gd$_2$O$_3$ and a mixture thereof. In an embodiment, the conductive paste comprises an inorganic oxide powder selected from the group consisting of Ho$_2$O$_3$, La$_2$O$_3$, Sm$_2$O$_3$, Yb$_2$O$_3$, Gd$_2$O$_3$ and a mixture thereof. In an embodiment, the conductive paste comprises an inorganic oxide powder selected from the group consisting of Ho$_2$O$_3$, Y$_2$O$_3$, Yb$_2$O$_3$, Gd$_2$O$_3$ and a mixture thereof. The inorganic oxide powder is selected from the group consisting of Sm$_2$O$_3$, Gd$_2$O$_3$ and a mixture thereof in an embodiment. The inorganic oxide binder is Sm$_2$O$_3$ in an embodiment.

The purity of the inorganic oxide powder can be no less than 97 wt % in an embodiment, no less than 98 wt % in another embodiment, based on the total weight of the powder. In those cases, the inorganic oxide powder can contain less than 2 wt % of e.g. unreacted materials based on the total weight of the powder.

In an embodiment, the shape of the inorganic oxide powder is spherical-shaped, flakes, nodular-shaped (irregular-shaped) or any combinations thereof.

The mean particle size (D50) of the inorganic oxide powder is 0.2 µm to 5.0 µm in an embodiment, 0.3 µm to 2.0 µm in another embodiment, and 0.3 µm to 1.8 µm in further embodiment. The inorganic oxide powders within the above mean particle ranges can effectively improve the adhesion of electrodes while keeping good photoelectric conversion efficiency (Eff (%)) of the solar cell.

In this disclosure, the particle diameter (D50) is obtained by measuring the distribution of the particle diameters by using a laser diffraction scattering method and can be defined as D50.

In an embodiment, the surface area (SA ($m^2/g$)) of the inorganic oxide powder is in the range of 0.1 to 100.0 ($m^2/g$). In another embodiment, the SA is 0.5 to 50.0 ($m^2/g$). In a further embodiment, the SA is 1.0 to 25.0 ($m^2/g$). The inorganic oxide powder having the SA inside the above ranges can effectively improve the adhesion of electrodes while keeping low contact resistance between electrode and silicon substrate.

The surface area (SA ($m^2/g$)) can be measured, for example, by BET nitrogen adsorption method.

In an embodiment, the conductive paste comprises 0.05 wt % to 1.5 wt % of the inorganic oxide powder, wherein the wt % are based on the total weight of the conductive paste. The lower limit of the inorganic oxide powder is 0.1 wt % in an embodiment, 0.2 wt % in an embodiment, 0.25 wt % in an embodiment, and 0.3 wt % in another embodiment. The upper limit of the inorganic oxide powder is 1.3 wt % in an embodiment, 1.0 wt % in an embodiment, 0.7 wt % in an embodiment, 0.6 wt % in an embodiment, and 0.5 wt % in an embodiment. The conductive paste comprising the inorganic oxide powder within the above ranges can effectively improve the adhesion of electrodes while keeping good photoelectric conversion efficiency (Eff (%)) of the solar cell.

(v) Additives

Multiple types of additives can be used. Type and amount of the additives can be chosen by people in the industry, in view of desired characteristics such as preservation stability, printability, or resulting electrical property.

(vi) Physical Properties of Conductive Paste

Viscosity

The viscosity of the conductive paste is 200-500 Pa·s, in an embodiment, 250-400 Pa·s in another embodiment from a viewpoint of printability. In the present invention, the viscosity of the conductive paste is a value obtained by measurement using a Brookfield viscometer (at 25° C., 10 rpm).

Inorganic Solids

The inorganic solids content of the conductive paste is calculated as the percentage (wt %) of inorganic solids relative to the total weight of the conductive paste. The inorganic solids comprise the conductive powder, the lead-tellurium-oxide powder, and the inorganic oxide powder in an embodiment.

The inorganic solids are 62 wt % to 97 wt % in an embodiment, and 85 wt % to 96 wt % in another embodiment. The conductive paste containing the inorganic solids within the above ranges can form, with satisfactory printability, an electrode pattern with a fine line width.

(vii) Preparation of the Conductive Paste

In an embodiment, the conductive paste can be prepared by mixing the conductive powder, the lead-tellurium-oxide powder, the organic medium, the inorganic oxide powder and other components. In some embodiments, the inorganic materials are mixed first, and they are then added to the organic medium. In other embodiments, an electrically conductive powder which is the major portion of the inorganics is slowly added to the organic medium. The viscosity can be adjusted, if needed, by the addition of solvents. Mixing methods that provide high shear are useful to disperse the particles in the medium.

Manufacturing of Solar Cell Electrodes

The conductive paste can be applied, for example, by screen-printing, stencil-printing, plating, extrusion, ink-jet printing, shaped or multiple printing onto a front side (light-receiving side) of a semiconductor substrate.

In this electrode-manufacturing process, the conductive paste is first dried and then heated to remove the organic medium and sinter the inorganic materials in an embodiment. The heating can be carried out in air or an oxygen-containing atmosphere in an embodiment. This step is commonly referred to as "firing".

The firing temperature profile is typically set so as to enable the burnout of organic binder materials from the dried paste composition, as well as any other organic materials present. In an embodiment, the firing temperature is 700 to 950° C. The firing can be conducted in a belt furnace using high transport rates, for example, 100-600 cm/min, with resulting hold-up times of 0.03 to 5 minutes. Multiple temperature zones can be used to control the desired thermal profile.

In an embodiment, a semiconductor device is manufactured from an article comprising a junction-bearing semiconductor substrate and a silicon nitride insulating film formed on a main surface thereof. The instant conductive paste is applied (e.g., coated or screen-printed) onto the insulating film, in a predetermined shape and thickness and at a predetermined position. The conductive paste has the ability to penetrate the insulating layer, either partially or fully. Firing is then carried out and the paste reacts with the insulating film and penetrates the insulating film, thereby effecting electrical contact with the silicon substrate and as a result the electrode is formed.

An example of this method of manufacturing the electrode is described below in conjunction with FIG. 1. However, the scope of the invention is not limited to the below specific embodiments.

A single crystal or multi-crystalline p-type silicon substrate 10 is provided (cf. FIG. 1(*a*)). An n-type diffusion layer 20 of the reverse conductivity type is formed by the thermal diffusion of phosphorus using phosphorus oxychloride as the phosphorus source (FIG. 1(*b*)). In the absence of any particular modifications, the diffusion layer 20 is formed over the entire surface of the silicon p-type substrate 10. The depth of the diffusion layer can be varied by controlling the diffusion temperature and time, and is generally formed in a thickness range of about 0.3 to 0.5 microns. The n-type diffusion layer may have a sheet resistivity of several tens of ohms per square up to about 120 ohms per square.

After protecting the front surface of this diffusion layer with a resist or the like, the diffusion layer 20 is removed from the rest of the surfaces by etching so that it remains only on the front surface (FIG. 1(*c*)). The resist is then removed using an organic solvent or the like.

Then, an insulating layer 30 which also functions as an anti-reflection coating (ARC) is formed on the n-type diffusion layer 20 (FIG. 1(*d*)). The insulating layer is commonly silicon nitride, but can also be a $SiN_x$:H film (i.e., the insulating film comprises hydrogen for passivation during subsequent firing processing), a titanium oxide film, a silicon oxide film, or a silicon oxide/titanium oxide film. A thickness of about 700 to 900 angstrom of a silicon nitride film is suitable for a refractive index of about 1.9 to 2.0. Deposition of the insulating layer 30 can be by sputtering, chemical vapor deposition, or other methods.

Next, the conductive paste of the present invention 500 is screen-printed on the insulating film 30 and then dried (FIG. 1(*e*)). In addition, an aluminum paste 60 and a back-side silver or silver/aluminum paste 70 are then screen-printed onto the back side of the substrate and successively dried. Firing is carried out in an infrared belt furnace at a temperature range of approximately 700 to 950° C. for a period of from several seconds to several tens of minutes.

Consequently, during firing, aluminum diffuses from the aluminum paste 60 into the silicon substrate 10 on the back side thereby forming a p+ layer 40 containing a high concentration of aluminum dopant (FIG. 1(*f*)). This layer is generally called the back surface field (BSF) layer, and helps to improve the energy conversion efficiency of the solar cell.

Firing converts the dried aluminum paste 60 to an aluminum back electrode 61. The back-side silver or silver/aluminum paste 70 is fired at the same time, becoming a silver or silver/aluminum back electrode 71. During firing, the boundary between the back-side aluminum and the back side silver or silver/aluminum assumes the state of an alloy, thereby achieving electrical connection.

Most areas of the back electrode are occupied by the aluminum electrode 61, owing in part to the need to form a p+ layer 40. Because soldering to an aluminum electrode is difficult, the silver or silver/aluminum back electrode 71 is formed over portions of the back side as an electrode for interconnecting solar cells by means of copper ribbon.

In addition, the front side conductive paste 500 sinters and penetrates through the insulating film 30 during firing, and thereby achieves electrical contact with the n-type layer 20. This type of process is generally called "fire through." The fired electrode 501 of FIG. 1(*f*) shows the result of the fire through.

All patents, applications, references and publications cited herein (ex. US-2011-0308597) are incorporated by reference in their entirety to the same extent as if they were individually incorporated by reference.

EXAMPLES

The present invention is illustrated by, but is not limited to, the following examples.
(Conductive Paste Preparation)
The conductive paste was produced using the following materials.
<Materials>
i) Conductive powder: Spherical Ag powder with mean particle diameter (D50) of 2.0 μm
ii) Lead-tellurium-oxide powder: PbO 48.03 wt %, $TeO_2$ 51.55 wt %, $Li_2O$ 0.42 wt %
iii) Organic medium: mixture of Components A, B and C at A/B/C=30/10/60
  Component A: a mixture of 10 wt % binder (ethyl cellulose) and 90 wt % solvent (texanol)
  Component B: organic additives (thixotropic agents, dispersant)
  Component C: solvents (solvent: texanol 60 wt %, butyl carbitol 40 wt %)
iv) Inorganic oxide powder:
  $Ho_2O_3$ Powder: D50=0.78 (μm), SA=18.4 ($m^2/g$)
  $La_2O_3$ Powder: D50=1.01 (μm), SA=2.2 ($m^2/g$)
  $Sm_2O_3$ Powder: D50=0.88 (μm), SA=5.5 ($m^2/g$)
  $Y_2O_3$ Powder: D50=1.51 (μm), SA=19.8 ($m^2/g$)
  $Yb_2O_3$ Powder: D50=0.43 (μm), SA=8.7 ($m^2/g$)
  $Gd_2O_3$ Powder: D50=1.07 (μm), SA=9.7 ($m^2/g$)
  $CeO_2$ Powder: D50=0.67 (μm), SA=8.6 ($m^2/g$)
(Procedure of the Preparations)
A conductive paste was prepared with the following procedure. The organic components were mixed in a glass vial for 48 hours at 100° C. to form an organic medium. Silver powders, lead-tellurium-oxide powders, inorganic oxides powders were added to the organic medium and mixed further for 5 minutes by a planetary centrifugal mixer to form a conductive paste. When well mixed, the conductive paste was repeatedly passed through a 3-roll mill for at progressively increasing pressures from 0 to 400 psi. and the gap of the rolls was adjusted to 1 mil. The degree of dispersion was measured by fineness of grind (FOG). A typical FOG value was generally equal to or less than 20/10 for a conductor. The content (wt %) of each component in each conductive paste are shown in Table 1 and Table 2.

TABLE 1

| Conductive paste composition | i) Ag powder (wt %) | ii) Lead-tellurium-oxide powder (wt %) | iii) Organic medium (wt %) | iv) Inorganic oxides powder (wt %) | Total (wt %) |
|---|---|---|---|---|---|
| Ex. 1 | 87.79 | 1.85 | 9.92 | $Ho_2O_3$(0.44) | 100.0 |
| Ex. 2 | 87.79 | 1.85 | 9.92 | $La_2O_3$(0.44) | 100.0 |
| Ex. 3 | 87.79 | 1.85 | 9.92 | $Sm_2O_3$(0.44) | 100.0 |
| Ex. 4 | 87.79 | 1.85 | 9.92 | $Y_2O_3$(0.44) | 100.0 |
| Ex. 5 | 87.79 | 1.85 | 9.92 | $Yb_2O_3$(0.44) | 100.0 |
| Ex. 6 | 87.79 | 1.85 | 9.92 | $Gd_2O_3$(0.44) | 100.0 |
| Co. Ex. 1 | 88.18 | 1.86 | 9.96 | — | 100.0 |
| Co. Ex. 2 | 87.79 | 1.85 | 9.92 | $CeO_2$(0.44) | 100.0 |

TABLE 2

| Conductive paste composition | i) Ag powder (wt %) | ii) Lead-tellurium-oxide powder (wt %) | iii) Organic medium (wt %) | iv) Inorganic oxides powder (wt %) | Total (wt %) |
|---|---|---|---|---|---|
| Ex. 7 | 87.95 | 1.85 | 9.93 | $Ho_2O_3$(0.27) | 100.0 |
| Ex. 8 | 87.95 | 1.85 | 9.93 | $Sm_2O_3$(0.27) | 100.0 |
| Ex. 9 | 87.95 | 1.85 | 9.93 | $Y_2O_3$(0.27) | 100.0 |
| Co. Ex. 3 | 88.18 | 1.86 | 9.96 | — | 100.0 |

(Manufacturing a Solar Cell Electrode)
The conductive paste was screen printed onto 1.5 square inch textured single crystalline silicone substrate with about 70 nm of SiNx antireflective coating on the front side. The pattern consisted of 18 fingers (70 microns wide) and 2 busbars (2.0 mm wide).

On the back side of the substrate, an aluminum conductive paste was coated by screen printing and dried. The drying temperature of the paste was 150° C. The resulting substrate was subjected to simultaneous firing of the coated pastes in an infrared furnace with a peak temperature of 750° C. and IN-OUT for about 1.5 min to obtain the desired test sample solar cell electrode.
(Electrical Measurements)
The solar cell electrodes built above was tested for efficiency (Eff (%)) using a model NCT-M-150AA cell tester manufactured by NPC Co. Xenon (Xe) arc lamp in the IV tester simulated the sunlight with 940 w/$m^2$ intensity and radiated over the formed electrode on the front surface of the cell. The tester used a four contact method to measure current (I) and voltage (V) at approximately 400 load resistance settings to determine the cell's I-V curve. Eff (%) was calculated from the I-V curve.
(Adhesion Measurements)
Adhesion of the electrode manufactured on the front side was measured by the following procedures. A copper ribbon coated with a Sn/Pb solder (Ulbrich Stainless Steels & Special Metals, Inc.) was dipped into a soldering flux (Kester-952s, Kester, Inc.) and then dried for five seconds in air. Half of the solder coated copper ribbon was placed on the bus electrode and soldering was done by a soldering system (SCB-160, SEMTEK Corporation Co., Ltd.). The soldering iron setting temperature was 190 to 240° C. and the actual temperature of the soldering iron at the tip was from 105° C. to 215° C. measured by K-type thermocouple.

The rest part of the copper ribbon which did not adhere to the electrode was horizontally folded and pulled at 120 mm/min by a machine (Peel Force 606, MOGRL Technology Co., Ltd.). The strength (Newton, N) at which the copper ribbon was detached was recorded as the solder adhesion.

(Results)

The results of the measurements were shown in Table 3 and Table 4.

TABLE 3

|  | iv) Inorganic oxides powder (wt %) | Eff (Co. Ex. 1 = 100) | Adhesion (N) |
|---|---|---|---|
| Ex. 1 | $Ho_2O_3$(0.44) | 102 | 2.3($\Delta$ = 1.3) |
| Ex. 2 | $La_2O_3$(0.44) | 102 | 2.2($\Delta$ = 1.2) |
| Ex. 3 | $Sm_2O_3$(0.44) | 101 | 2.6($\Delta$ = 1.6) |
| Ex. 4 | $Y_2O_3$(0.44) | 99 | 4.2($\Delta$ = 3.2) |
| Ex. 5 | $Yb_2O_3$(0.44) | 101 | 2.4($\Delta$ = 1.4) |
| Ex. 6 | $Gd_2O_3$(0.44) | 102 | 2.7($\Delta$ = 1.7) |
| Co. Ex. 1 | — | 100 | 1.0($\Delta$ = 0) |
| Co. Ex. 2 | $CeO_2$(0.44) | 100 | 1.1($\Delta$ = 0.1) |

TABLE 4

|  | iv) Inorganic oxides powder (wt %) | Eff (Co. Ex. 1 = 100) | Adhesion (N) |
|---|---|---|---|
| Ex. 7 | $Ho_2O_3$(0.27) | 99 | 2.5($\Delta$ = 1.2) |
| Ex. 8 | $Sm_2O_3$(0.27) | 100 | 2.1($\Delta$ = 0.8) |
| Ex. 9 | $Y_2O_3$(0.27) | 97 | 2.8($\Delta$ = 1.5) |
| Co. Ex. 3 | — | 100 | 1.3($\Delta$ = 0) |

(Correlation Between the Wt % of the Inorganic Oxide and the Adhesion)

In order to assess the correlation between the content of the inorganic oxide powder and the adhesion of the resulting electrode, the following experiments were conducted.

Using different types of $Sm_2O_3$ powder as the inorganic oxide powder, conductive pastes were prepared according to the procedure for Ex. 1-Ex. 9 except that the conductive pastes were screen printed onto 6 square inch textured single crystalline silicone substrate with about 70 nm of SiNx anti-reflective coating on the front side and that the pattern consisted of 100 fingers (45 microns wide) and 3 busbars (1.6 mm wide).

As to the efficiency and the adhesion, the average was calculated for each of the sample set containing the same amount of $Sm_2O_3$. Sample set A, set B, set C, set D, set E and set F contained 0 wt %, 0.125 wt %, 0.25 wt %, 0.375 wt %, 0.50 wt % and 1.00 wt % of $Sm_2O_3$ respectively. The result is shown in Table 5.

TABLE 5

|  | iv) Inorganic oxides powder (wt %) | Eff (Co. Ex. 1 = 100) | Adhesion (N) |
|---|---|---|---|
| Set A | None (0.00) | 100 | 1.37($\Delta$ = 0) |
| Set B | $Sm_2O_3$(0.13) | 100 | 2.36($\Delta$ = 0.99) |
| Set C | $Sm_2O_3$(0.25) | 100 | 2.51($\Delta$ = 1.14) |
| Set D | $Sm_2O_3$(0.38) | 99 | 2.75($\Delta$ = 1.38) |
| Set E | $Sm_2O_3$(0.50) | 99 | 2.67($\Delta$ = 1.30) |
| Set F | $Sm_2O_3$(1.00) | 97 | 1.72($\Delta$ = 0.35) |

What is claimed is:

1. A method of manufacturing a solar cell electrode comprising steps of:
preparing a semiconductor substrate comprising a front side and a back side;
applying onto the front side of the semiconductor substrate a conductive paste comprising, (i) 60 wt % to 95 wt % of a conductive powder, based on the total weight of the conductive paste, (ii) 0.1 wt % to 5.0 wt % of a lead-tellurium-oxide powder, based on the total weight of the conductive paste, comprising 20 wt % to 60 wt % of PbO and 20 wt % to 60 wt % of $TeO_2$, based on the total weight of the lead-tellurium-oxide powder, (iii) 3 wt % to 38 wt % of an organic medium, based on the total weight of the conductive paste, and (iv) 0.1 wt % to 1.5 wt % of an inorganic oxide powder selected from the group consisting of $Ho_2O_3$, $La_2O_3$, $Sm_2O_3$, $Y_2O_3$, $Yb_2O_3$, $Gd_2O_3$ and a mixture thereof, based on the total weight of the conductive paste; and
firing the applied conductive paste to from an electrode.

2. The method of manufacturing a solar cell electrodes of claim 1, wherein mean particle seize (D50) of the inorganic oxide powder is 0.3 to 1.8 μm.

3. The method of manufacturing a solar cell electrode of claim 1, wherein the inorganic oxide powder is 0.2 wt % to 1.3 wt %, based on the total weight of the conductive paste.

4. The method of manufacturing a solar cell electrode of claim 1, wherein the inorganic oxide powder is 0.25 wt % to 0.5 wt %, based on the total weight of the conductive paste.

5. The method of manufacturing a solar cell electrodes of claim 1, wherein the conductive paste comprises 0.25 wt % to 0.5 wt % of $Sm_2O_3$, based on the total weight of the conductive paste.

6. The method of manufacturing a solar cell electrodes of claim 1, wherein surface area (SA) of the inorganic oxide powder is in the range of 0.1 to 100.0 ($m^2$/g).

* * * * *